US011393513B2

(12) United States Patent
Stave

(10) Patent No.: US 11,393,513 B2
(45) Date of Patent: Jul. 19, 2022

(54) TIMING OF READ AND WRITE OPERATIONS TO REDUCE INTERFERENCE, AND RELATED DEVICES, SYSTEMS, AND METHODS

(71) Applicant: Micron Technology, Inc., Boise, ID (US)

(72) Inventor: Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 17/108,850

(22) Filed: Dec. 1, 2020

(65) Prior Publication Data

US 2022/0172755 A1 Jun. 2, 2022

(51) Int. Cl.
*G11C 7/02* (2006.01)
*G11C 7/22* (2006.01)

(52) U.S. Cl.
CPC ........... *G11C 7/222* (2013.01); *G11C 7/02* (2013.01); *G11C 2207/229* (2013.01); *G11C 2207/2281* (2013.01)

(58) Field of Classification Search
CPC .................................. G11C 7/222; G11C 7/02
USPC .......................................................... 365/206
See application file for complete search history.

(56) References Cited

U.S. PATENT DOCUMENTS

| 5,758,188 A * | 5/1998 | Appelbaum ............ G06F 13/28 710/1 |
| 8,296,540 B2 * | 10/2012 | Garlepp ............... G11C 7/1048 374/103 |
| 9,343,165 B2 * | 5/2016 | Vaysman ............... G11C 16/30 |
| 2009/0238025 A1 * | 9/2009 | Shaeffer ............... G11C 7/1063 365/194 |

* cited by examiner

*Primary Examiner* — Muna A Techane
(74) *Attorney, Agent, or Firm* — TraskBritt

(57) ABSTRACT

Devices, systems, and methods for timing elements of memory read and write operations are disclosed. A device may include a first DQ pin, a second DQ pin, and an output circuit. The output circuit may be configured to provide: a first signal at the first DQ pin and a second signal at the second DQ pin, based on the timing pattern. In some embodiments, based on the timing pattern, the output circuit may be configure to delay the first signal relative to the second signal such that rising and falling edges of the first signal do not coincide with rising and falling edges of the second signal. In these or other embodiments, the device may further include a mode register, wherein a slew rate of the first signal is based at least in part on a value of the mode register. Associated systems and methods are also disclosed.

20 Claims, 9 Drawing Sheets

TIMING OF READ AND WRITE OPERATIONS TO REDUCE INTERFERENCE, AND RELATED DEVICES, SYSTEMS, AND METHODS

TECHNICAL FIELD

Embodiments of the disclosure relate to memory devices. More specifically, various embodiments relate to timing of read and write operations in memory devices, and to related methods, devices, and systems.

BACKGROUND

Memory devices are typically provided as internal, semiconductor-based, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data rate memory (DDR), low-power double-data rate memory (LPDDR), phase-change memory (PCM), and Flash memory.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
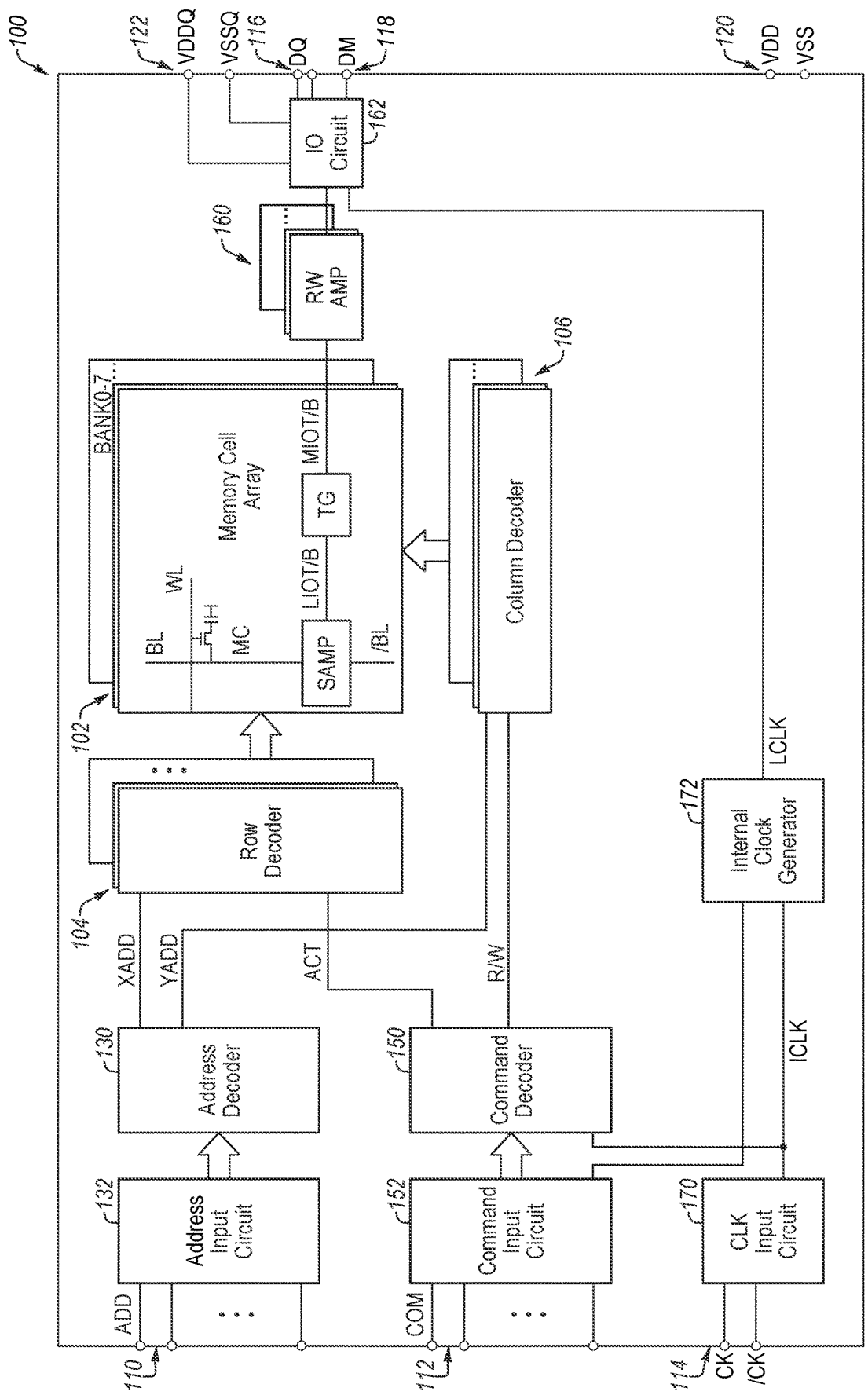
FIG. 1 is a functional block diagram illustrating an example memory device, in accordance with at least one embodiment of the present disclosure.

A memory device may include multiple input/output (DQ) pins. The memory device may be configured to provide signals at one or more of the multiple DQ pins (e.g., in response to a read command). Also, the memory device may be configured to receive signals at one or more of the multiple DQ pins (e.g., in response to a write command).

Signals, both provided to and received from a memory device, may be encoded by two values (e.g., a low-voltage value and a high-voltage value). By default, a memory device (and/or a host with which the memory device is communicating) may be configured to generate signals with sharp rising and falling edges (i.e., with short rise and fall times), e.g., to provide for a large data eye opening. A data eye opening may be related to durations of time during which the signals hold values. A large data eye opening may allow for longer read durations.

Unfortunately, sharp rising and falling signal edges may cause electromagnetic emissions. The electromagnetic emissions may interfere with other (e.g., nearby) devices or components. In the present disclosure, electromagnetic emissions from a device may be referred to as electromagnetic interference (EMI), e.g., from the perspective of other devices or components. Sharp rising and falling signal edges may cause more EMI than flatter rising and falling signal edges.

Multiple signals (e.g., on multiple DQ pins) having simultaneous rising and falling edges, especially sharp rising and falling edges, can result in more EMI than sharp rising and falling edges of a single signal. Thus, multiple signals being received simultaneously at or sent simultaneously from a memory device including multiple DQ pins (e.g., during a write or read operation) may result in more EMI than a single signal or than multiple signals having flatter rising and falling edges.

One or more devices and/or systems of the present disclosure may operate according to one or more timing patterns that may decrease EMI. EMI may cause issues with wireless communications e.g., Bluetooth® and wireless communications according to Institute of Electrical and Electronics Engineers (IEEE) standard 802.11. Additionally, EMI can cause issues with signaling on a printed circuit board (PCB) as traces on a PCB can act like antenna. Thus, decreasing EMI may improve operations of systems and/or components of systems including the devices and/or systems of the present disclosure. For example, a system including a device that operates according to one or more timing patterns of the present disclosure may have a lower chance of faults resulting from EMI than a system including another device.

Some embodiments described herein may decrease a slew rate of signaling compared to conventional devices, systems, and methods. A decreased slew rate may result in decreased EMI compared with EMI generated by conventional devices, systems, and methods. In some embodiments a slew rate may be based on a value of at least one bit of a mode register. For example, a memory device may include a mode register that includes at least one bit to store a value that may be interpreted as an instruction to set the slew rate of signals at at least some DQ pins of the memory device.

Additionally or alternatively, some embodiments may skew a first signal at a first DQ pin of a memory device relative to a second signal at a second DQ pin of the memory device. The skewed signals may result in decreased EMI compared with conventional devices, systems, and methods. For example, a memory device may be configured to skew each signal at each DQ pin relative to the other signals at other DQ pins. The resulting mutually skewed signals may cause less EMI than would be caused by unskewed signals. Additionally, the skewed signals may be less affected by crosstalk than unskewed signals. For example, in a case in which multiple transmitters are transmitting to a single receiver, skewing the transmitters (or signals therefrom) can result in better signaling at the receiver.

Some embodiments described herein may be configured to set or adjust signaling at one or more pins (e.g., DQ pins) separately. For example, some embodiments may be configured to set a skew for each DQ pin separately. These or other embodiments, may include a mode register configured to store a value for each DQ pin. These or other embodiments may be configured to read the stored value for each DQ pin and set the skew for each DQ pin based on the stored value.

Some embodiments may be used in memory systems or devices configured for point-to-point memory access, daisy-chain memory access, and/or systems that use per-pin training.

FIG. 1 is a functional block diagram illustrating an example memory device 100, in accordance with at least one embodiment of the present disclosure. Memory device 100 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), a SGRAM (synchronous graphics random access memory) or a three-dimensional (3D) DRAM. Memory device 100, which may be integrated on a semiconductor chip, may include a memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over the complementary main data lines MIOT/B, transfer gate TG, and complementary local data lines LIOT/B, and written in the memory cell MC coupled to bit line BL or /BL.

Memory device 100 may be generally configured to be receive various inputs (e.g., from an external controller or host) via various terminals, such as address terminals 110, command terminals 112, clock terminals 114, data terminals 116, and data mask terminals 118. Memory device 100 may include additional terminals such as a power supply terminal 120 and a power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

An active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and bit line BL specified by the column address YADD may be selected.

In response to active command ACT, a read signal, a row address XADD, and a column address YADD, data may be read from the memory cell MC specified by row address XADD and column address YADD. The read data may be output via sense amplifier SAMP, transfer gate TG, read/write amplifiers 160, an input/output circuit 162, and data terminals 116. Further, in response active command ACT, a write signal, a row address XADD, and a column address YADD, write data may be supplied to memory array 102 via data terminals 116, input/output circuit 162, read/write amplifiers 160, transfer gate TG, and sense amplifier SAMP. The write data may be written to the memory cell MC specified by row address XADD and column address YADD.

Clock signals CK and /CK may be received via clock terminals 114. A CLK Input circuit 170 may generate internal clock signals ICLK based on the clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling a timing pattern of input/output circuit 162). Further, data mask terminals 118 may receive one or more data mask signals DM. When the data mask signal DM is activated, overwrite of corresponding data may be prohibited.

Figure 2:
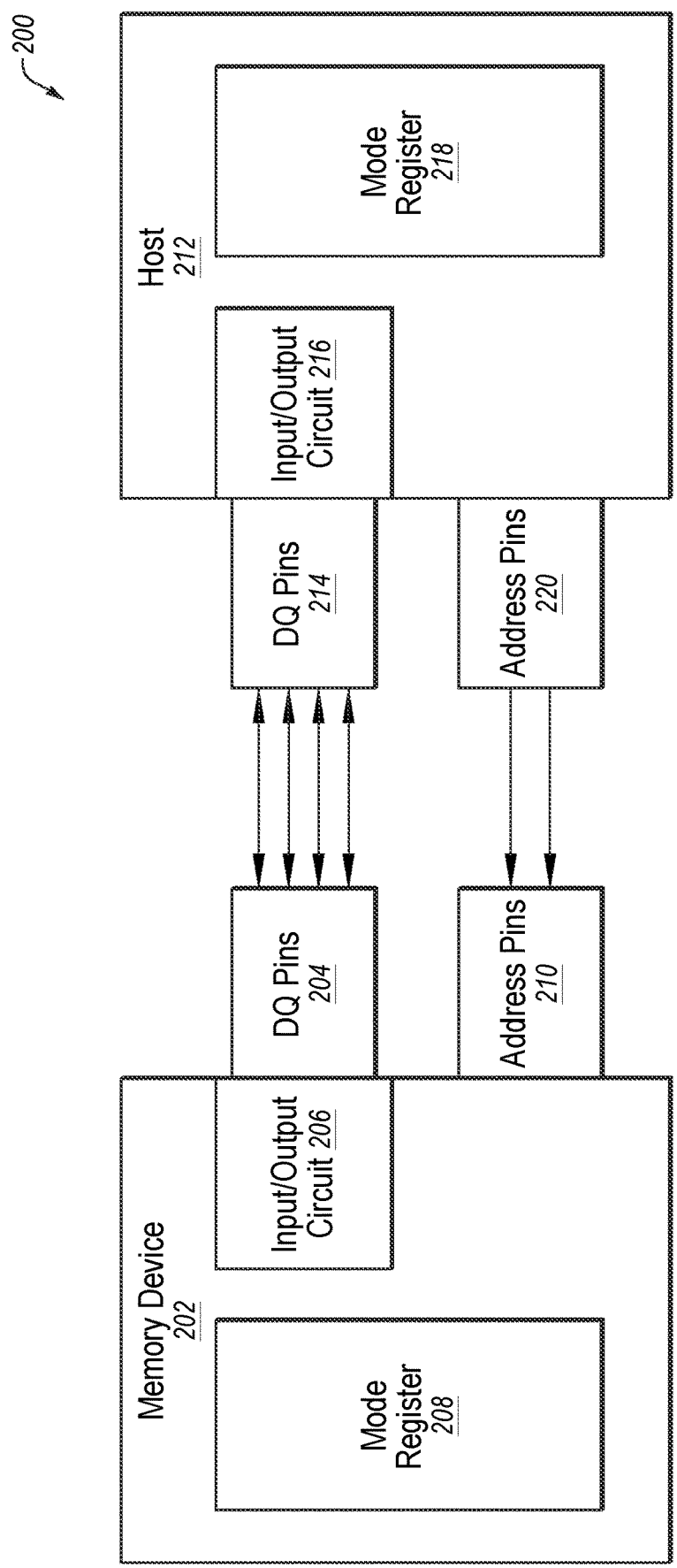
FIG. 2 is a functional block diagram illustrating an example memory system, in accordance with at least one embodiment of the present disclosure.

FIG. 2 is a functional block diagram illustrating an example memory system 200, in accordance with at least one embodiment of the present disclosure. Memory system 200 includes a memory device 202 and a host 212. Memory device 202 includes an input/output circuit 206, input/output pins "DQ pins" 204, a mode register 208, and address pins 210. Host 212 includes an input/output circuit 216, input/output pins "DQ pins" 214, a mode register 218 and address pins 220.

Memory device 202 may be an example of memory device 100 of FIG. 1. Memory device 202 may be configured to store data, e.g., in memory cells of a memory array. Memory device 202 may be configured to receive the data (e.g., in a write operation) and provide the data (e.g., in a read operation). Memory device 202 may be or include memory according to any suitable configuration, e.g., a point-to-point configuration, DRAM, SDRAM, DDR, a single in-line memory module (SIMM) or a dual in-line memory module (DIMM).

Host 212 may be a device that may interface with or include memory device 202. Examples of host 212 include: a personal computer, a laptop, a tablet, and a smart phone. Additionally or alternatively, the memory device 202 and host 212 may make up or be part of a system on a chip. Host 212 (and/or memory device 202) may be configured to employ per-pin training operations.

DQ pins 204 may be an example of data terminals 116. DQ pins 204 (and DQ pins 214) may be configured for electrical coupling between devices or components (e.g., between memory device 202 and host 212). Four lines are illustrated between DQ pins 204 and DQ pins 214 as an example. In various embodiments, DQ pins 204 and/or DQ pins 214 may include any number of pins. DQ pins 204 and/or DQ pins 214 may be configured for exchanging data (e.g., through read and write operations) between memory device 202 and host 212.

Input/output circuit 206 may be an example of input/output circuit 162 of FIG. 1. Input/output circuit 206 may be configured to control and read voltages at DQ pins 204, and input/output circuit 216 may be configured to control and read voltages at DQ pins 214.

For example, in a read operation, memory device 202 may use input/output circuit 206 to control voltages at DQ pins 204 (and, by virtue of the electrical coupling between DQ pins 204 and DQ pins 214, DQ pins 214) to provide signals (e.g., one at each of DQ pins 204) representing data stored at memory device 202. Host 212, through input/output circuit 216, may read the voltages at DQ pins 214 thereby receiving the signals. Host 212 may interpret the signals as the data.

Further, for example, in a write operation, host 212 may use input/output circuit 216 to control voltages at DQ pins 214 (and, by virtue of the electrical coupling between DQ pins 214 and DQ pins 204, DQ pins 204) to provide signals (e.g., one at each of DQ pins 214) representing data to be stored at memory device 202. Memory device 202, through input/output circuit 206 may read the voltages at DQ pins 204 thereby receiving the signals. Memory device 202 may store the data, e.g., in memory cells.

Mode register 208 and mode register 218 may be configured to store configuration information (i.e., via one or more settings) in memory device 202 and host 212 respectively. Mode register 208 and/or mode register 218 may take any suitable form of storing including, e.g., fuses, latches, or memory cells. Mode register 208 and/or mode register 218 may be configured to store data related to communications between memory device 202 and host 212. Specifically, mode register 208 and/or mode register 218 may store bits that may be interpretable as instructions regarding timing patterns for signals between memory device 202 and host 212. For example, in some embodiments, there may be one or more bits in mode register 208 that may store one or more values that may be interpretable as an instruction to set a slew rate of signals provided by memory device 202. As another example, in some embodiments, there may be one or more bits in mode register 218 that may store one or more values that may be interpretable as an instruction to set a slew rate of signals provided by host 212. As another example, in some embodiments, there may be one or more bits in mode register 208 that may store one or more values that may be interpretable as an instruction to skew one or more of the signals provided by memory device 202 at DQ pins 204 relative to other signals provided by memory device 202 at DQ pins 204. As yet another example, in some embodiments, there may be one or more bits in mode register 218 that may store one or more values that may be interpretable as an instruction to skew one or more of the signals provided by host 212 at DQ pins 214 relative to other signals provided by host 212 at DQ pins 214.

In some embodiments, mode register 208 and/or mode register 218 may be configured to store separate information for separate pins. For example, mode register 208 and/or mode register 218 may be configured to store information on a per-pin basis. In particular, mode register 208 may store one or more values indicative of skew and/or a slew rate for each of DQ pins 204 and/or address pins 210. Likewise, mode register 218 may be configured to store one or more values indicative of skew and/or a slew rate for each of DQ pins 214 and/or address pins 220. As a specific example, memory device 202 may be configured to skew signals at each of DQ pins 204 separately based on one or more values stored in mode register 208 for each of DQ pins 204.

Address pins 210 may be an example of address terminals 110 of FIG. 1. Address pins 210 (and address pins 220) may be configured for electrical coupling between devices or components (e.g., between memory device 202 and host 212). Two lines are illustrated between address pins 210 and address pins 220 as an example; in various embodiments, address pins 210 and/or address pins 220 may include any number of pins. Address pins 210 and address pins 220 may be configured for communication of addresses between memory device 202 and host 212. As a specific example, host 212 may communicate, via one or more address pins, an address of memory to be written to or read from along with a write or read command.

Figure 3:
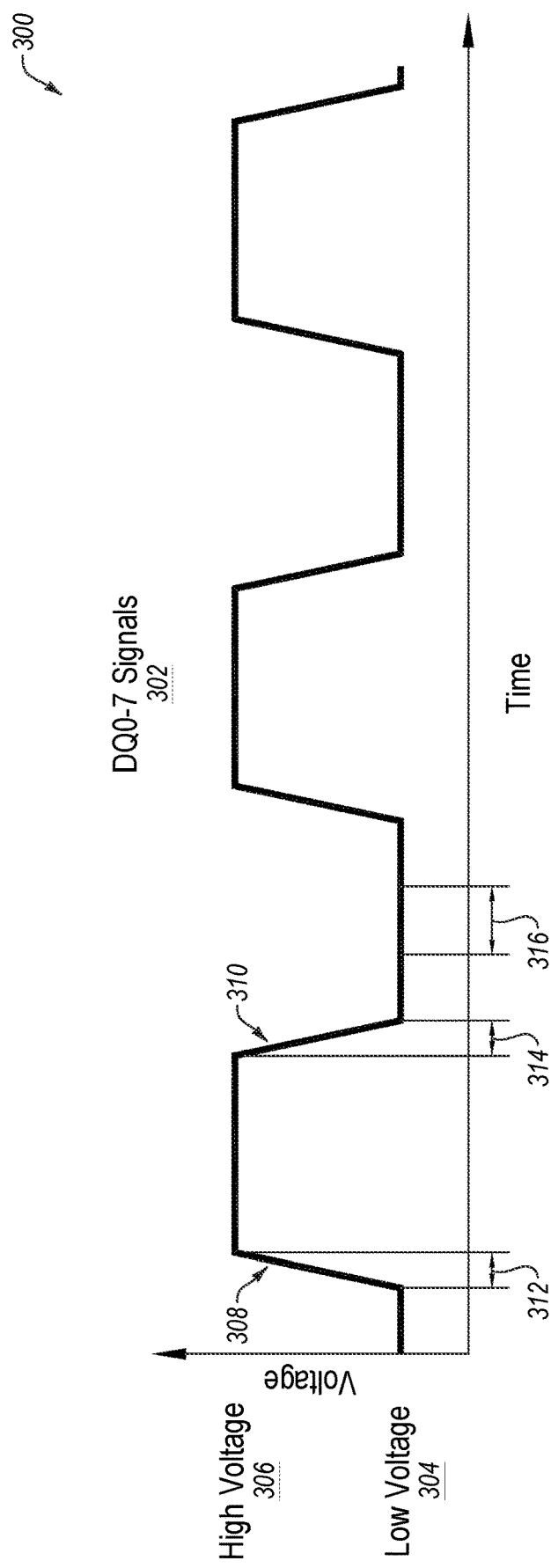
FIG. 3 is a timing diagram illustrating a timing pattern of DQ signals.

FIG. 3 is a timing diagram illustrating a timing pattern 300 of DQ0-7 signals 302. DQ0-7 signals 302 exhibit several features that will be particularly discussed herein. DQ0-7 signals 302 vary between a low voltage 304 and a high voltage 306. DQ0-7 signals 302 have a rising edge 308 when transitioning from low voltage 304 to high voltage 306 and a falling edge 310 when transitioning from high voltage 306 to low voltage 304. DQ0-7 signals 302 transition between low voltage 304 and high voltage 306 during transition times (e.g., rise time 312 and fall time 314). Rise time 312 is the duration of rising edge 308. In other words, rise time 312 is the time it takes for DQ0-7 signals 302 to transition from low voltage 304 to high voltage 306. Fall time 314 is the duration of falling edge 310. In other words, fall time 314 is the time it takes for DQ0-7 signals 302 to transition from high voltage 306 to low voltage 304. Read duration 316 may be a duration of time designated for a receiver of DQ0-7 signals 302 to read the voltages of DQ0-7 signals 302 to interpret values encoded by DQ0-7 signals 302.

The term "slew rate" may refer to the change in voltage of a transition divided by the transition time. For example, a rising slew rate of DQ0-7 signals 302 may be (high voltage 306−low voltage 304)/rise time 312 and a falling slew rate of DQ0-7 signals 302 may be (low voltage 304−high voltage 306)/fall time 314. In some cases, DQ0-7 signals 302 may have the same rising slew rate and falling slew rate.

Although only one of each of the features (rising edge 308, falling edge 310, rise time 312, fall time 314, and read duration 316) of DQ0-7 signals 302 is labeled, DQ0-7 signals 302 may exhibit any number of such features. Additionally, although FIG. 3 illustrates eight (8) DQ signals (e.g., DQ0-7 signals 302), various embodiments may include any number of DQ signals. The number of DQ signals may be the same as or less than the number of DQ pins.

For illustrative purposes, all of DQ0-7 signals 302 of FIG. 3 are illustrated as alternating together between low voltage 304 and high voltage 306. DQ0-7 signals 302 may be eight (8) individual signals, each of which may be either of low voltage 304 or high voltage 306 during each read duration 316 and each of which may transition (or not transition) independent of the other signals during each transition time (e.g., rise time 312 and fall time 314).

In some cases, sharp rising edges 308 and/or falling edges 310 may cause EMI. Additionally, multiple rising edges 308 and falling edge 310 at the same time (e.g., during transition times) may result in more EMI than a single rising edge 308. Thus, DQ0-7 signals 302 according to timing pattern 300 may exhibit more EMI than other timing patterns described herein. In other words, other timing patterns described herein may represent an improvement over timing pattern 300 at least because the other timing patterns may result in less EMI than results from timing pattern 300. Additionally, other timing patterns described herein may be less susceptible to the effects of crosstalk than signals according to timing pattern 300.

Figure 4:
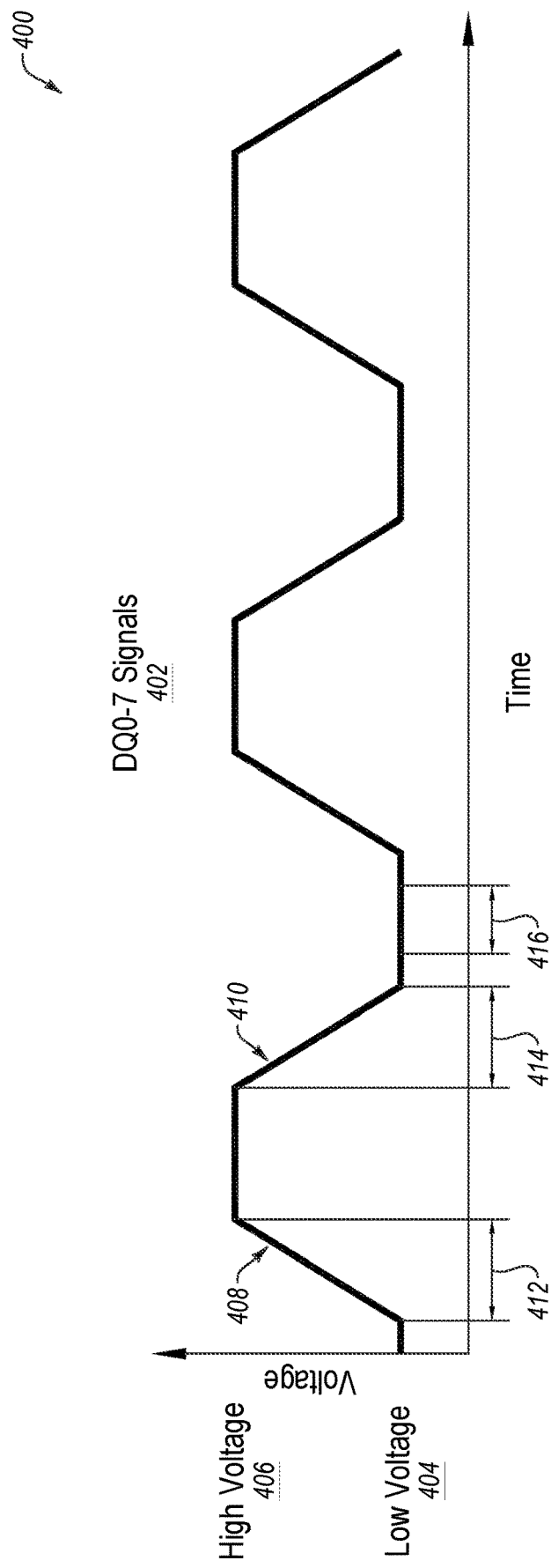
FIG. 4 is a timing diagram illustrating an example timing pattern of DQ signals according to at least one embodiment of the present disclosure.

FIG. 4 is a timing diagram illustrating an example timing pattern 400 of DQ0-7 signals 402 according to at least one embodiment of the present disclosure. DQ0-7 signals 402 exhibit many of the same features as DQ0-7 signals 302 of FIG. 3. For example, DQ0-7 signals 402 may vary between a low voltage 404 and a high voltage 406. DQ0-7 signals 402 may transition between low voltage 404 and high voltage 406 during transition times (e.g., rise time 412 and fall time 414). Read duration 416 may be a duration of time designated for a receiver of DQ0-7 signals 402 to read the voltages of DQ0-7 signals 402 to interpret values encoded by DQ0-7 signals 402.

Also, similar to DQ0-7 signals 302 of FIG. 3, for illustrative purposes, all of DQ0-7 signals 402 of FIG. 4 are illustrated as alternating together between low voltage 404 and high voltage 406. DQ0-7 signals 402 may be eight (8) individual signals, each of which may be either of low voltage 404 or high voltage 406 during each read duration 416 and each of which may transition (or not transition) independent of the other signals during each transition time (e.g., rise time 412 and fall time 414).

The transition times of timing pattern 400 are longer in duration than the transition times of timing pattern 300 of FIG. 3. For example, rise time 412 is longer in duration than rise time 312 of FIG. 3 and fall time 414 is longer than fall time 314 of FIG. 3. The longer transition times of timing pattern 400 (compared to timing pattern 300 of FIG. 3) may correspond to a lower slew rate of DQ0-7 signals 402 compared to DQ0-7 signals 302 of FIG. 3.

The slew rate of DQ0-7 signals 402, according to timing pattern 400, may be configured to not affect voltages of DQ0-7 signals 402 during read durations, (e.g., read duration 416). Thus, despite the lower slew rate (compared to DQ0-7 signals 302 of FIG. 3), a recipient of DQ0-7 signals 402 may be just as able to interpret the values of the DQ0-7 signals 402 as a recipient of DQ0-7 signals 302 of FIG. 3 may be able to interpret the values of DQ0-7 signals 302 of FIG. 3.

The lower slew rate of DQ0-7 signals 402 (compared to DQ0-7 signals 302 of FIG. 3), according to timing pattern 400, may result in less EMI being generated by DQ0-7 signals 402 than is generated by DQ0-7 signals 302 of FIG. 3. Thus, timing pattern 400 may represent an improvement over timing pattern 300 of FIG. 3.

Timing pattern 400 may be used by either a memory device (e.g., memory device 202 of FIG. 2) or a host (e.g., host 212). For example, a memory device may provide data as signals at DQ pins, e.g., as part of a read operation, according to timing pattern 400. As another example, a host may provide data as signals at DQ pins, e.g., as part of a write operation. Additionally, a host may provide address information (e.g., one or more memory addresses) as signals at address pins (as part of a read or write operation) according to timing pattern 400.

In some embodiments, timing pattern 400 may be used rather than a timing pattern with a higher slew rate (e.g., timing pattern 300) based on one or more values stored in a mode register. For example, one or more values may be programmed into the mode register by a user depending on a recipient of signals. Additionally or alternatively, one timing pattern may be used instead of another based on operating characteristics, e.g., as indicated by a delay-locked loop (DLL). For example, a user may be able to adjust a slew rate by adjusting the operating characteristics.

In some embodiments, values of one or more bits of a mode register (e.g., mode register 208 or mode register 218 of FIG. 2) may indicate a timing pattern to use. For example, values of one or more bits of a mode register may indicate a slew rate to use. The values of the one or more bits of the mode register may be set according to a read duration of a recipient, a recipient type, or a type of connection with the recipient. Additionally or alternatively, the values of the one or more bits of the mode register may be set when the device (e.g., the memory device and/or the host) are manufactured and/or when the device and its host are connected.

Figure 5:
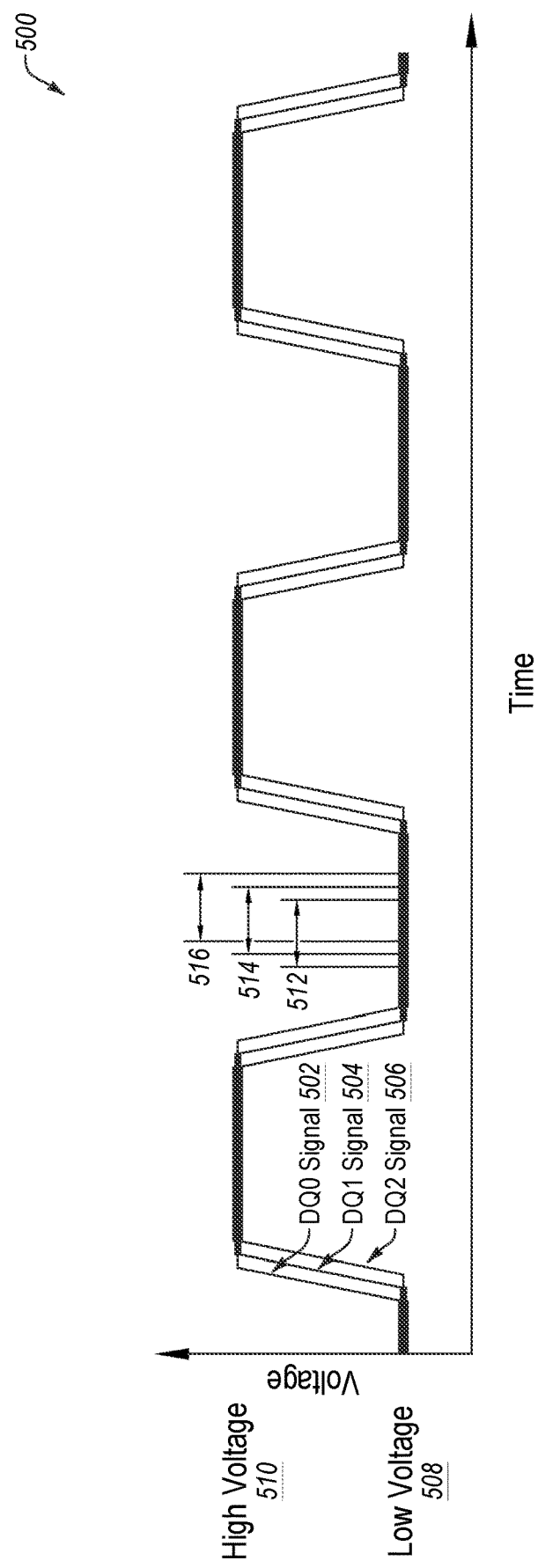
FIG. 5 is a timing diagram illustrating another example timing pattern of DQ signals according to at least one embodiment of the present disclosure.

FIG. 5 is a timing diagram illustrating another example timing pattern 500 of DQ signals (e.g., DQ0 signal 502, DQ1 signal 504, and DQ2 signal 506) according to at least one embodiment of the present disclosure. Each of DQ0 signal 502, DQ1 signal 504, and DQ2 signal 506 exhibit many of the same features as DQ0-7 signals 302 of FIG. 3 and DQ0-7 signals 402 of FIG. 4. For example, each of DQ0 signal 502, DQ1 signal 504, and DQ2 signal 506 may vary between a low voltage 508 and a high voltage 510. Each of DQ0 signal 502, DQ1 signal 504, and DQ2 signal 506 may transition between low voltage 508 and high voltage 510 during transition times (e.g., rise times and fall times) (not labeled in FIG. 5). Read durations (e.g., DQ0 read time 512, DQ1 read time 514, and DQ2 read time 516) may be durations of time designated for a receiver of DQ0 signal 502, DQ1 signal 504, and DQ2 signal 506 to read the voltages of DQ0 signal 502, DQ1 signal 504, and DQ2 signal 506 to interpret values encoded by DQ0 signal 502, DQ1 signal 504, and DQ2 signal 506.

Also, similar to DQ0-7 signals 302 of FIG. 3 and DQ0-7 signals 402 of FIG. 4, for illustrative purposes, all of DQ0 signal 502, DQ1 signal 504, and DQ2 signal 506 of FIG. 5 are illustrated as having the same pattern of values (e.g., alternating between low voltage 508 and high voltage 510). DQ0 signal 502, DQ1 signal 504, and DQ2 signal 506 may be three (3) individual signals, each of which may be either of low voltage 508 or high voltage 510 during each read duration and each of which may transition (or not transition) independent of the other signals during each transition time.

However, in contrast to timing pattern 300 of FIG. 3 and timing pattern 400 of FIG. 4, DQ0 signal 502, DQ1 signal 504, and DQ2 signal 506 transition between low voltage 508 and high voltage 510 at different times according to timing pattern 500. For example, according to timing pattern 500, DQ0 signal 502 may transition between low voltage 508 and high voltage 510 before DQ1 signal 504 transitions which may transition before DQ2 signal 506.

In FIG. 5, a thickness of the lines representing DQ0 signal 502, DQ1 signal 504, and DQ2 signal 506 illustrates a number of signals having the a value at the corresponding time. In particular, because each of DQ0 signal 502, DQ1 signal 504, and DQ2 signal 506 transitions between low voltage 508 and high voltage 510 separately, the lines during the transition times are thin compared to the lines between the transition times.

According to timing pattern 500, one or more signals may be skewed (e.g., delayed or advanced) relative to one or more other signals. In the present disclosure the term "skew" may refer to delaying or advancing a signal relative to another signal or a default timing of the signal. In particular, among a group of signals provided at a group of pins (e.g., DQ pins or address pins) one or more of the signals may be skewed relative to one or more of the other signals. For example, according to timing pattern 500, DQ2 signal 506 may be delayed relative to DQ1 signal 504 which may be delayed relative to DQ0 signal 502.

In some embodiments, each of the signals (e.g., DQ0 signal 502, DQ1 signal 504, and DQ2 signal 506) may be skewed relative to a timing signal. Each of the signals may be skewed relative to the timing signal by a different amount. The result of skewing signals by different amounts relative to a timing signal may be that each of the signals is skewed relative to the other signals.

A duration of the delay of each of the signals may be based on a number of signals being provided (e.g., at adjacent pins). Additionally or alternatively, the duration of the delay may be based on a read duration or signaling rate.

In some embodiments, signals may be skewed relative to a read duration. For example, some of the signals may be advanced relative to a read duration (e.g., DQ1 read time 514) and some of the signals may be delayed relative to the read duration.

In some embodiments, a recipient of the signals (i.e., a receiver) may perform per-pin training. Per-pin training may include adjusting a read duration according to a provided signal. Per-pin training may be performed on a per pin basis. In particular, a receiver may determine a receiver timing pattern for each pin independently. Each of the receiver timing patterns may be based on signals received at a corresponding pin. For example, for a DQ pin on the receiver side coupled to DQ0, a receiver may determine to read voltages at DQ0 read time 512 based on DQ0 signal 502 and in particular based on a duration between the transition times of DQ0 signal 502. Separately, for a DQ pin on the receiver side coupled to DQ1, the receiver may determine to read voltages at DQ1 read time 514 and for a DQ pin on the receiver side coupled to DQ2, the receiver may determine to read voltages at DQ2 read time 516. DQ0 read time 512 may be centered between the transition times of DQ0 signal 502, DQ1 read time 514 may be centered between transition times of DQ1 signal 504, and DQ2 read time 516 may be centered between transition times of DQ2 signal 506.

The skewing of DQ0 signal 502, DQ1 signal 504, and DQ2 signal 506, according to timing pattern 500, may result in less EMI being generated by DQ0 signal 502, DQ1 signal 504, and DQ2 signal 506 than is generated by DQ0-7 signals 302 of FIG. 3. Thus, timing pattern 500 may represent an improvement over timing pattern 300 of FIG. 3. Additionally, timing pattern 500 may represent an improvement over timing patter 300 because signals according to timing pattern 500 may be less susceptible to the effects of crosstalk than signals according to timing pattern 300.

Timing pattern 500 may be used by either a memory device (e.g., memory device 202 of FIG. 2) or a host (e.g., host 212). For example, a memory device may provide data as signals at DQ pins, e.g., as part of a read operation, according to timing pattern 500. As another example, a host may provide data as signals at DQ pins, e.g., as part of a write operation. Additionally, a host may provide address information (e.g., one or more memory addresses) as signals at address pins (as part of a read or write operation) according to timing pattern 500.

In some embodiments, timing pattern 500 may be used rather than a timing pattern in which all signals transition at the same time (e.g., timing pattern 300) based on one or more values stored in a mode register. For example, one or more values may be programmed into the mode register by a user depending on a recipient of signals. Additionally or alternatively, one timing pattern may be used instead of another based on a factory setting. For example, when a system or device is produced, skewing may be set.

In some embodiments, values of one or more bits of a mode register (e.g., mode register 208 or mode register 218 of FIG. 2) may indicate a timing pattern to use. For example, values of one or more bits of a mode register may indicate a skew duration (e.g., between adjacent pins) to use. The values of the one or more bits of the mode register may be set according to a read duration, a recipient type, or a type of connection to the recipient. Additionally or alternatively, the values of the one or more bits of the mode register may be set when the device (e.g., the memory device and/or the host) are produced and/or when the device and its host are connected.

The one or more bits of the mode register may separately store values indicative of skew for two or more separate pins. For example, the one or more bits of the mode register may separately store a first value indicative of a skew of DQ0 signal 502, a second value indicative of a skew of DQ1 signal 504, and a third value indicative of a skew of DQ2 signal 506.

Figure 6:
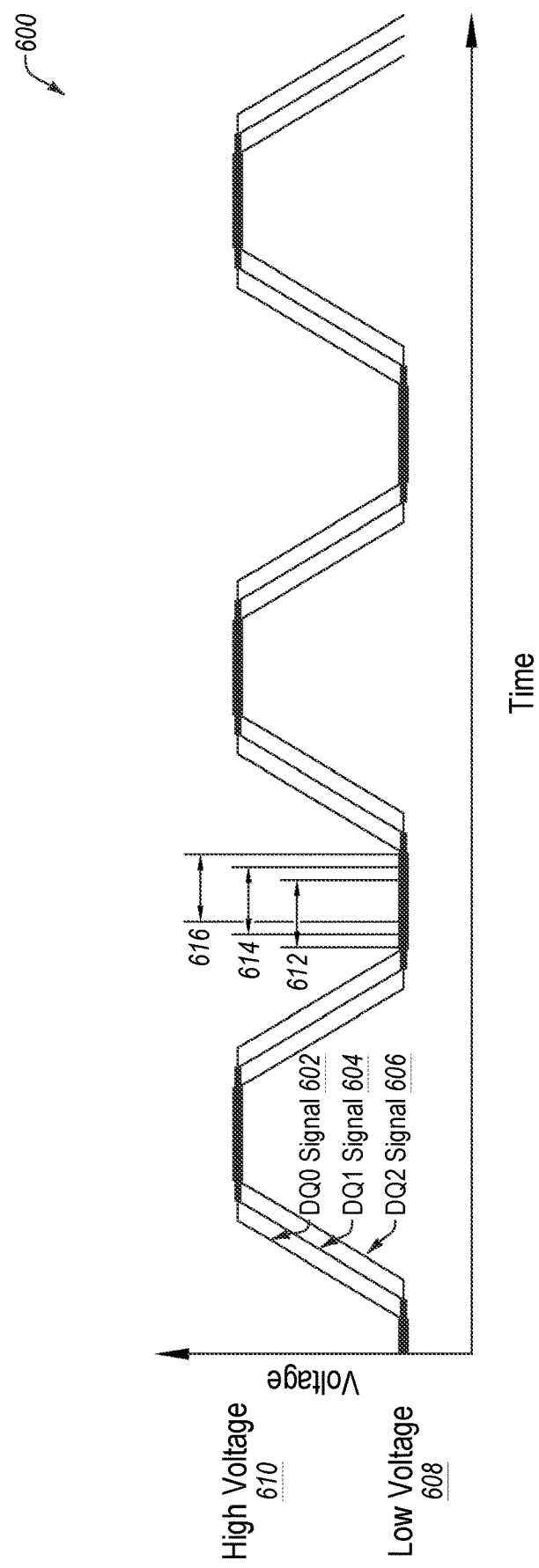
FIG. 6 is a timing diagram illustrating yet another example timing pattern of DQ signals according to at least one embodiment of the present disclosure.

FIG. 6 is a timing diagram illustrating yet another example timing pattern 600 of DQ signals (e.g., DQ0 signal 602, DQ1 signal 604, and DQ2 signal 606) according to at least one embodiment of the present disclosure.

Timing pattern 600 may include aspects of timing pattern 400 and timing pattern 500. In particular, timing pattern 600 may include a lower slew rate than timing pattern 300, and, signals, according to timing pattern 600 may be skewed relative to one another.

The skewing and slewing of DQ0 signal 602, DQ1 signal 604, and DQ2 signal 606, according to timing pattern 600, may result in less EMI being generated by DQ0 signal 602, DQ1 signal 604, and DQ2 signal 606 than is generated by DQ0-7 signals 302 of FIG. 3. Thus, timing pattern 600 may represent an improvement over timing pattern 300 of FIG. 3. Additionally, timing pattern 600 may represent an improvement over timing patter 300 because signals according to timing pattern 600 may be less susceptible to the effects of crosstalk than signals according to timing pattern 300.

Timing pattern 600 may be used by either a memory device (e.g., memory device 202 of FIG. 2) or a host (e.g., host 212). For example, a memory device may provide data as signals at DQ pins, e.g., as part of a read operation, according to timing pattern 600. As another example, a host may provide data as signals at DQ pins, e.g., as part of a write operation. Additionally, a host may provide address information (e.g., one or more memory addresses) as signals at address pins (as part of a read or write operation) according to timing pattern 600.

In some embodiments, timing pattern 600 may be used rather than a timing pattern with a higher slew rate and/or in which all signals transition at the same time (e.g., timing pattern 300) based on information about per-pin training and/or read durations of a recipient of the signals. For example, in some embodiments, a training process may be used to determine information about per-pin training and/or read durations of the recipient. The information about per-pin training and/or read durations may be used to determine durations of skewing and/or slew rates that may be used without affecting voltages during read durations. In other embodiments, skewing and/or slewing (e.g., as in timing pattern 600) may be used based on other information, e.g., based on a connection type between the memory device and the host. As a specific example, a memory device may be configured to select skewing durations and/or slew rates based on a type of connection between the memory device and a host.

Figure 7:
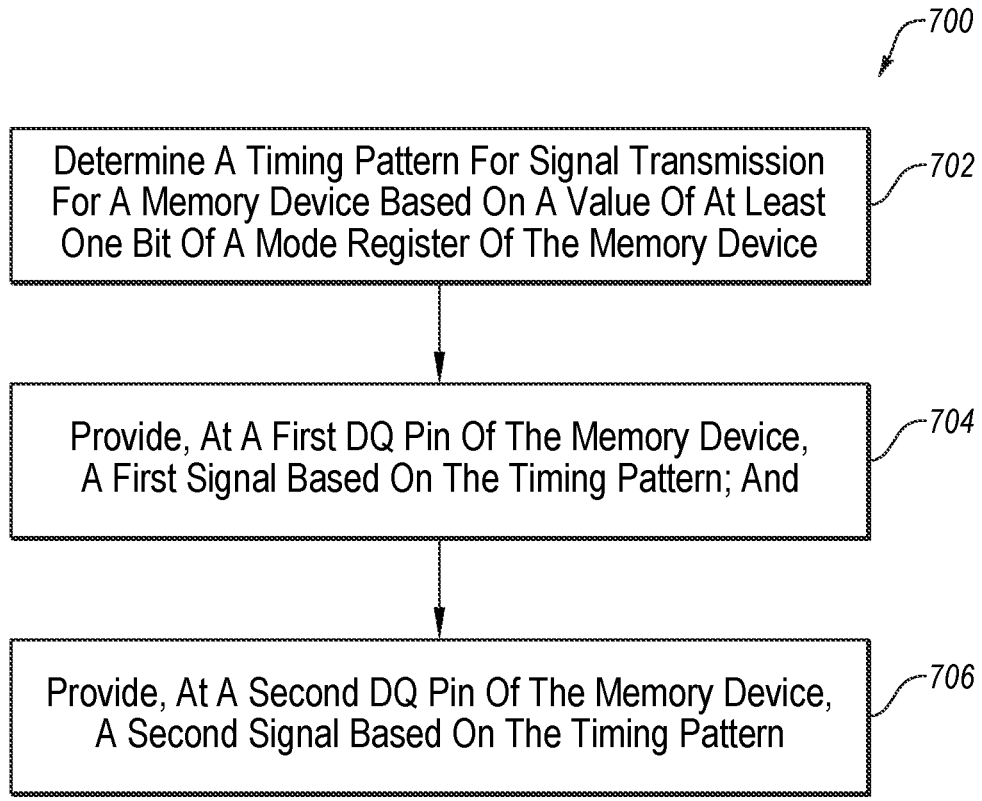
FIG. 7 is a flowchart illustrating an example method in accordance with at least one embodiment of the present disclosure.

FIG. 7 is a flowchart illustrating an example method 700 in accordance with at least one embodiment of the present disclosure. Method 700 may be arranged in accordance with at least one embodiment described in the present disclosure. Method 700 may be performed, in some embodiments, by a device or system, such as memory device 100 of FIG. 1, memory system 200 of FIG. 2, memory device 202 of FIG. 2, host 212 of FIG. 2, memory system 800 of FIG. 9, electronic system 900 of FIG. 9, or another device or system. Although illustrated as discrete blocks, various blocks may be divided into additional blocks, combined into fewer blocks, or eliminated, depending on the desired implementation.

At block 702, a timing pattern for signal transmission may be determined based on a value of at least one bit of a mode register of a memory device. The value may be interpretable as an indication of a timing pattern, or of an aspect of the timing pattern. Mode register 208 and mode register 218 are examples of the mode register of block 702.

At block 704, a first signal may be provided at a first DQ pin of the memory device based on the timing pattern. At block 706, a second signal may be provided at a second DQ pin of the memory device based on the timing pattern.

For example, the value may be interpretable as an indication to slew or as a particular slew rate. Based on the value, the first signal may be provided at the first pin slewed or with the particular slew rate. Also, the second signal may be provided at the second pin slewed or with the particular slew rate. Timing pattern 400 of FIG. 4 illustrates an example of slewed signals according to method 700.

As another example, the value may be interpretable as indication to skew one or more signals. Based on the value, the first signal and the second signal may be provided skewed relative to one another. Timing pattern 500 of FIG. 5 illustrates an example of slewed signals according to method 700.

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 8:
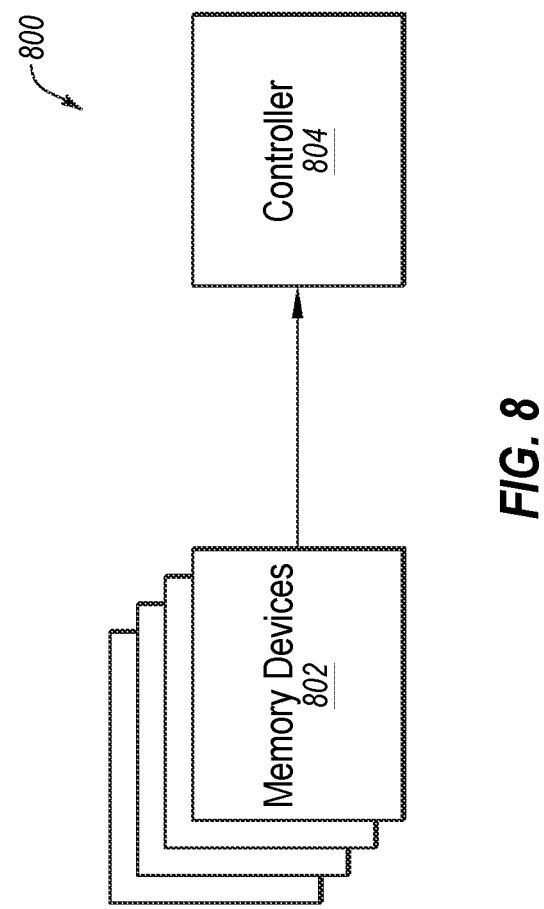
FIG. 8 is a simplified block diagram illustrating an example memory system, in accordance with at least one embodiment of the present disclosure.

FIG. 8 is a simplified block diagram illustrating an example memory system 800 implemented in accordance with at least one embodiment of the present disclosure. Memory system 800, which may include, for example, a semiconductor device, includes a number of memory devices 802 and a controller 804. Controller 804 may be operatively coupled with memory devices 802 so as to convey command/address signals (e.g., command/address signals received by command terminals 112 and/or address terminals 110 of FIG. 1) to memory devices 802.

At least one of memory devices 802 (e.g., memory device 100 of FIG. 1) and/or controller 804 of memory system 800 may operate according to one or more timing pattern 400, timing pattern 500, and/or timing pattern 600, according to one or more embodiments disclosed herein. Additionally or alternatively, memory system 800 may be configured to implement one or more blocks of method 700 described in the present disclosure.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 9:
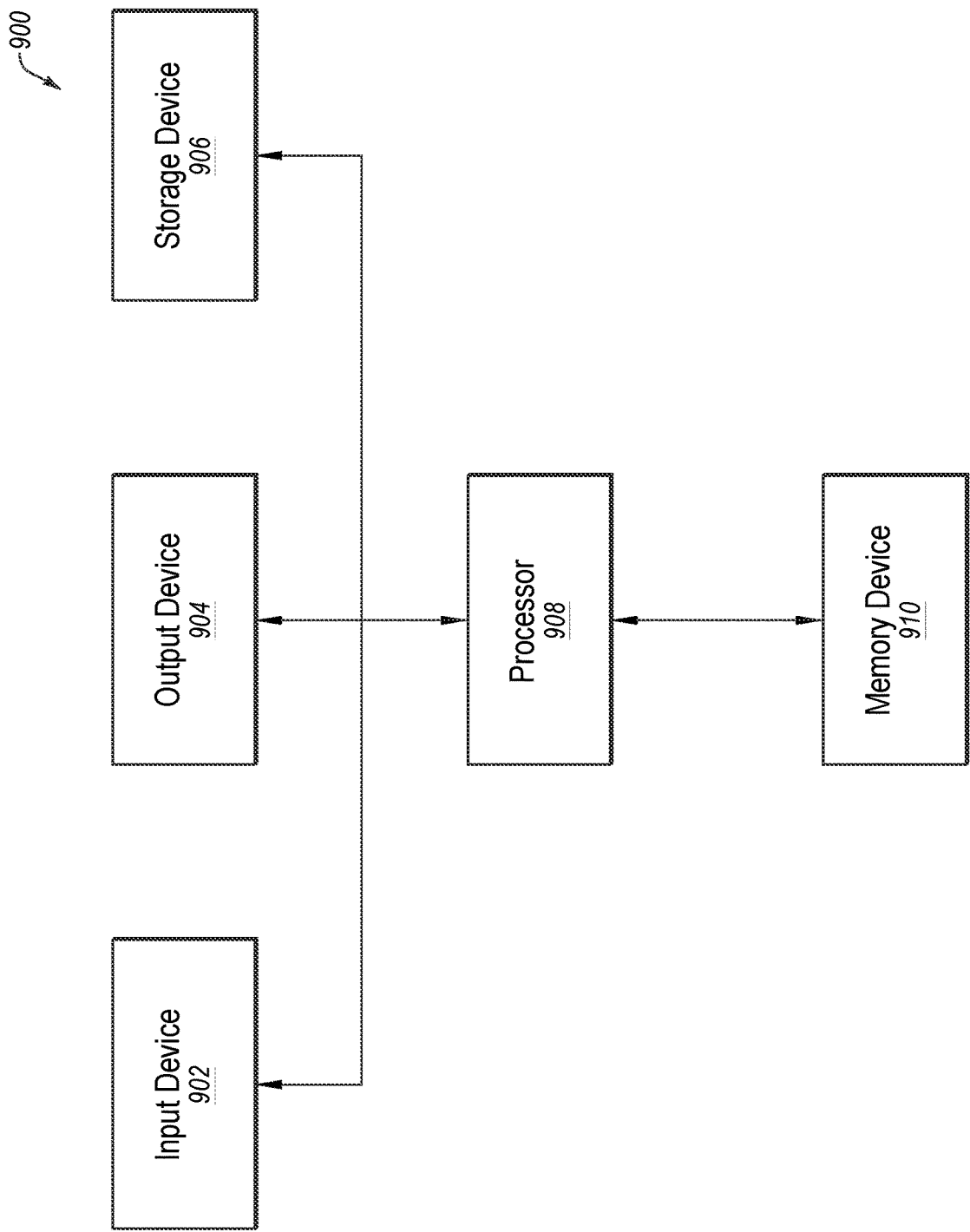
FIG. 9 is a simplified block diagram illustrating an example electronic system, in accordance with at least one embodiment of the present disclosure.

FIG. 9 is a simplified block diagram illustrating an electronic system 900 implemented in accordance with at least one embodiment of the present disclosure. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes a storage device 906. Input device 902, output device 904, and storage device 906 may be coupled to a processor 908. Electronic system 900 further includes a memory device 910 coupled to processor 908. Memory device 910 may include at least a portion of memory system 800 of FIG. 8. Electronic system 900 may include, for example, a computing, processing, industrial, or consumer product. For example, without limitation, electronic system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

One or more embodiments of the present disclosure may include a device. The device may include a first pin, a second pin, and an output circuit. The output circuit may be configured provide a first signal at the first pin based on a timing pattern and provide a second signal at the second pin based on the timing pattern. The timing pattern may be indicative of one or both of a delay between the first signal and the second signal and a slew rate of at least one of the first signal and the second signal.

One or more embodiments of the present disclosure may include a system. The system may include a memory device and a host. The memory device may include a first pin, a second pin, and an output circuit. The output circuit may be configured to generate a number of signals based on a timing pattern indicative of one or both of a delay between at least two signals of the number of signals and a slew rate of the number of signals. The host may include a third pin communicatively coupled to the first pin of the memory device, a fourth pin communicatively coupled to the second pin of the memory device, and an input circuit. The input circuit may be configured to receive the first signal and receive the second signal.

One or more embodiments of the present disclosure may include a method. The method may include determining a timing pattern for signal transmission for a memory device based on a value of at least one bit of a mode register of the memory device. The method may also include providing, at a first DQ pin of the memory device, a first signal based on the timing pattern. The method may also include providing, at a second DQ pin of the memory device, a second signal based on the timing pattern.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device comprising:
    a first pin;
    a second pin; and
    an output circuit configured to:
        provide a first signal at the first pin based on a timing pattern; and
        provide a second signal at the second pin based on the timing pattern, the timing pattern indicative of one or both of a delay between the first signal and the second signal and a slew rate of at least one of the first signal and the second signal.

2. The device of claim 1, wherein, based on the timing pattern, the output circuit is configured to delay the first signal relative to the second signal such that rising and falling edges of the first signal do not coincide with rising and falling edges of the second signal.

3. The device of claim 2, wherein the device further comprises a mode register and the output circuit is configured to delay the first signal relative to the second signal based on a first value of at least one bit of the mode register and a second value of at least one other bit of the mode register, the first value related to the first pin, the second value related to the second pin.

4. The device of claim 2, wherein the device comprises a memory device communicatively coupled to a host, wherein the first signal is indicative of one or more first values stored by the memory device, and wherein the second signal is indicative of one or more second values stored by the memory device.

5. The device of claim 2, wherein the device comprises a host communicatively coupled to a memory device, wherein the first signal is indicative of one or more first values to be stored by the memory device and the second signal is indicative of one or more second values to be stored by the memory device.

6. The device of claim 2, wherein the device comprises a host configured to communicatively couple to a memory device, wherein the first pin comprises a first address pin, wherein the second pin comprises a second address pin, wherein the first signal is indicative of a memory address of the memory device; and wherein the second signal is indicative of the memory address of the memory device.

7. The device of claim 2, wherein the device is configured to communicatively couple to a second device, the second device comprising:
    a third pin communicatively coupled to the first pin;
    a fourth pin communicatively coupled to the second pin; and
    an input circuit configured to:
        receive the first signal;
        receive the second signal;
        determine a second timing pattern of the third pin based on the receipt of the first signal;
        determine a third timing pattern of the fourth pin based on the receipt of the second signal;
        receive a third signal at the third pin based on the second timing pattern; and
        receive a fourth signal at the fourth pin based on the third timing pattern.

8. The device of claim 7, wherein:
    the first signal comprises a first training signal;
    the second signal comprises a second training signal;
    the third signal is indicative of one or more first values stored by or to be stored by a memory device; and
    the fourth signal is indicative of one or more second values stored by or to be stored by the memory device.

9. The device of claim 1, the device further comprising a mode register, wherein a first slew rate of the first signal and a second slew rate of the second signal, based on the timing pattern, are based at least in part on at least one value of at least one bit of the mode register.

10. The device of claim 9, wherein the first slew rate is based on a first value of the at least one value and the second slew rate is based on a second value of the at least one value.

11. The device of claim 9, wherein the device is configured to communicatively couple to a second device, wherein the first slew rate and the second slew rate are based at least in part on a receiver timing pattern of the second device.

12. The device of claim 9, wherein the device is a memory device configured to communicatively couple to a host, wherein the first signal is indicative of one or more first values stored by the memory device, and wherein the second signal is indicative of one or more second values stored by the memory device.

13. The device of claim 9, wherein the device is a host configured to communicatively couple to a memory device, wherein the first signal is indicative of one or more first values to be stored by the memory device, and wherein the second signal is indicative of one or more second values to be stored by the memory device.

14. The device of claim 9, wherein the device comprises a host configured to communicatively couple to a memory device, wherein the first pin comprises a first address pin, wherein the second pin comprises a second address pin, wherein the first signal is indicative of a memory address of the memory device; and wherein the second signal is indicative of the memory address of the memory device.

15. A system comprising:
    a memory device comprising:
        a first pin;
        a second pin; and
        an output circuit configured to:
            generate a number of signals based on a timing pattern indicative of one or both of a delay between at least two signals of the number of signals and a slew rate of the number of signals; and
    a host comprising:
        a third pin communicatively coupled to the first pin of the memory device;
        a fourth pin communicatively coupled to the second pin of the memory device; and
        an input circuit configured to:
            receive a first signal of the at least two signals of the number of signals; and
            receive a second signal of the at least two signals of the number of signals.

16. The system of claim 15, wherein, based on the timing pattern, the output circuit is configured to delay the first signal relative to the second signal such that rising and falling edges of the first signal do not coincide with rising and falling edges of the second signal.

17. The system of claim 15, the memory device further comprising a mode register, wherein a first slew rate of the first signal and a second slew rate of the second signal, based on the timing pattern, are based at least in part on a value of the mode register.

18. A method comprising:
    determining a timing pattern for signal transmission for a memory device based on a value of at least one bit of a mode register of the memory device;
    providing, at a first pin of the memory device, a first signal based on the timing pattern; and
    providing, at a second pin of the memory device, a second signal based on the timing pattern, the timing pattern indicative of one or both of a delay between the first signal and the second signal and a slew rate of at least one of the first signal and the second signal.

19. The method of claim 18, further comprising delaying, based on the timing pattern, the first signal relative to the second signal such that rising and falling edges of the first signal do not coincide with rising and falling edges of the second signal.

20. The method of claim 18, wherein providing the first signal based on the timing pattern further comprises providing the first signal with the slew rate based on the value from the mode register.

* * * * *